United States Patent [19]
Lagues

[11] Patent Number: 5,916,697
[45] Date of Patent: *Jun. 29, 1999

[54] MULTILAYER MATERIAL AND DEVICE COMPRISING THIS MATERIAL

[75] Inventor: Michel Lagues, Fontenay-Aux-Roses, France

[73] Assignees: Michael Lagues, Fontenay-Aux-Roses; Jacques Lewiner, Saint-Cloud; Ufinnova, Paris, all of France

[ * ] Notice: This patent issued on a continued prosecution application filed under 37 CFR 1.53(d), and is subject to the twenty year patent term provisions of 35 U.S.C. 154(a)(2).

[21] Appl. No.: 08/640,812
[22] PCT Filed: Nov. 10, 1994
[86] PCT No.: PCT/FR94/01320
  § 371 Date: Sep. 23, 1996
  § 102(e) Date: Sep. 23, 1996
[87] PCT Pub. No.: WO95/13628
  PCT Pub. Date: May 18, 1995

[30] Foreign Application Priority Data

Nov. 12, 1993 [FR] France ................................. 93 13510

[51] Int. Cl.⁶ ............................. B32B 9/00; H01L 39/12
[52] U.S. Cl. ...................... 428/699; 428/701; 428/702; 428/930; 252/519.1; 252/519.13; 505/120; 505/121; 505/125; 505/190; 505/191; 505/210
[58] Field of Search .................................... 505/110, 120, 505/121, 125, 782, 783, 785, 190, 191, 210; 428/689, 699, 701, 702, 930; 252/518, 521, 519.1, 519.13, 519.14

[56] References Cited

U.S. PATENT DOCUMENTS 5,084,265  1/1992  Harada et al. ........................... 423/592
5,264,413  11/1993  Bozovic et al. ......................... 505/121

FOREIGN PATENT DOCUMENTS 305 292 A2  3/1989  European Pat. Off. .
451 641 A1  10/1991  European Pat. Off. .
504 804 A1  9/1992  European Pat. Off. .

OTHER PUBLICATIONS

*CRC Handbook of Chemistry and Physics*, 71st ed. (1990), CRC Press, Inc., p. 12–1.

"Low–Temperature Annealing Effect on Bi—Sr—Ca—Cu—O Thin Films Prepared by Layer–By–Layer Deposition", A. Tsukamoto, et al, *Japanese Journal of Applied Physics*, vol. 30, No. 5A, May 1991, pp. L830–L833, Tokyo, Japan.

"Hoch–$T_c$–Supraleiter: Wie steht es mit den Anwendungen?", R. Hott, *Phys Bl*, 48 (1992) No. 5, pp. 355–358.

"Superconductivity of $Bi_2$–$Sr_2Ca_{n-1}Cu_nO_y$(N=2, 3, 4, and 5) thin films prepared in situ by molecular–beam epitaxy technique", Y. Nakayama et al, *J. Appl. Phys.* 70(8), Oct. 15, 1991, pp. 4371–4377.

*Primary Examiner*—Marie Yamnitzky
*Attorney, Agent, or Firm*—Larson & Taylor

[57] ABSTRACT

A material formed as a film comprised of monomolecular layers (2,3,4,5) stacked on a substrate (1), wherein said film includes at least one first set (R) of layers which form an electric charge reservoir, and a second set (S) of layers which form a conductive cell and which contain a number of conductive copper oxide layers (4), separated from each other by intermediate layers (5), the reservoir and the conductive cell being adjacent in the layer stack. There are at least four conductive copper oxide layers, and the intermediate layers have the chemical formula $Ca_{1-x}M_x$ and are free of strontium, wherein x is a real number between 0 and 0.2, M is a component with an ionic radius close to that of the $Ca^{2+}$ ion, and the intermediate layers may be complete or not.

12 Claims, 1 Drawing Sheet

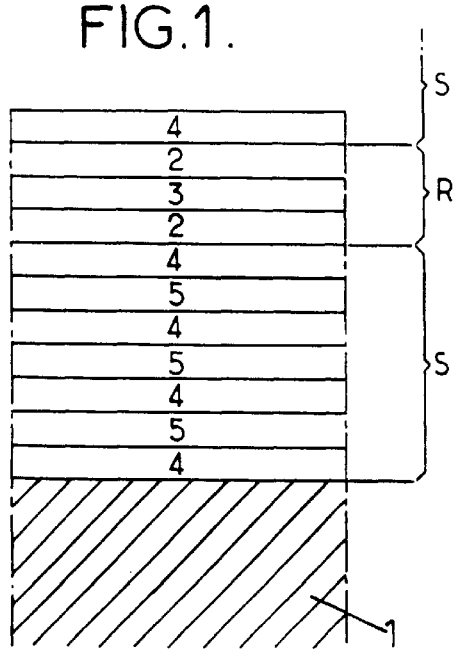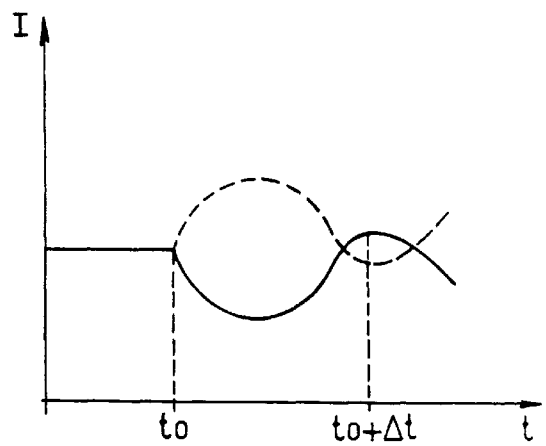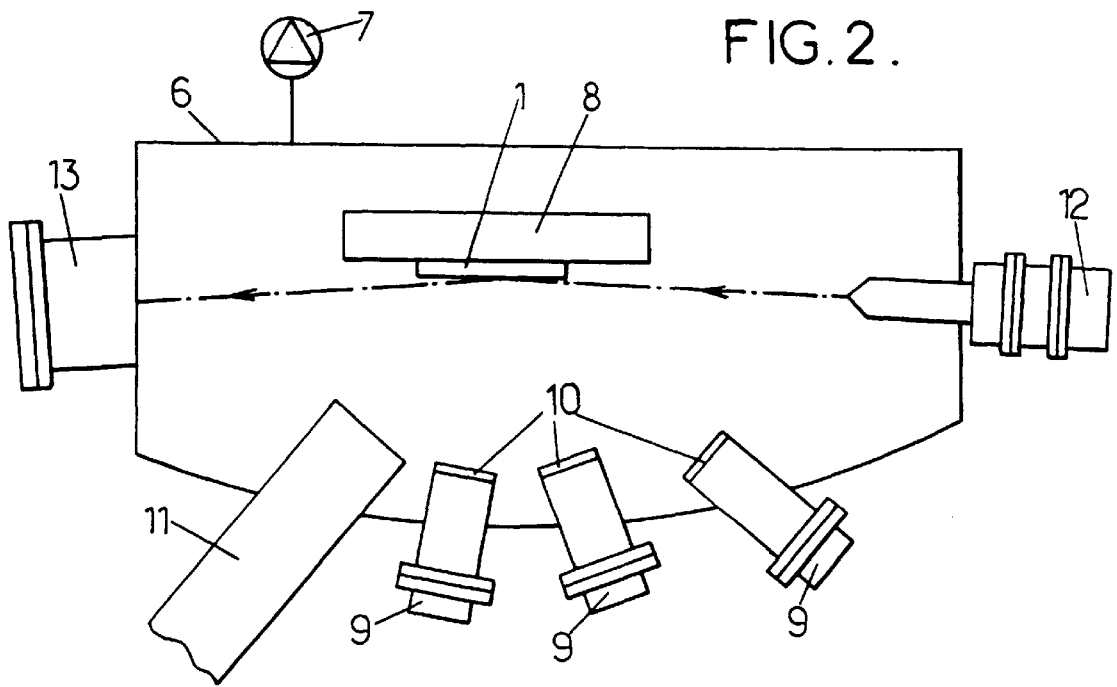

MULTILAYER MATERIAL AND DEVICE COMPRISING THIS MATERIAL

The present invention relates to a superconducting material in the form of a film consisting of monomolecular layers superposed with one another on a substrate, including at least one first assembly of layers which constitutes an electric charge reservoir, and at least one second assembly of layers which forms a superconducting cell and which consists of a certain number n of superconducting layers, separated from one another by intermediate layers, the charge reservoir and the superconducting cell being adjacent in the stack of layers.

As used in this context, the term "monomolecular layer" indicates a layer consisting of a single thickness of the atoms or molecules constituting said layer.

A material as defined above is disclosed, for example, in document EP-A-0 305 292. However, in view of the method for obtaining the material which is disclosed in this document, it is probable that its layers are not strictly monomolecular and have numerous aggregates in which the species constituting the layers are distributed over a plurality of thicknesses (three-dimensional aggregates).

Furthermore, in several known examples of superconducting materials, the superconducting layers consist of a planar copper oxide, in general $CuO_2$, often referred to as cuprate.

Known superconducting materials have a critical temperature of no more than 135K at atmospheric pressure, and 155K under very high pressure.

In other words, known superconducting materials must be cooled to below 135K at atmospheric pressure in order to become superconductors, which leads to very high operating costs and great technical difficulties.

The object of the present invention is to overcome this drawback.

To this end, according to the present invention, a superconducting material of the type in question is essentially characterized in that n is an integer at least equal to 4 and in that the intermediate layers have the chemical formula $Ca_{1-x}M_x$ and are free of strontium, x being a real number at least equal to 0 and at most equal to 0.2, M being an element having an ionic radius close to that of the $Ca^{2+}$ ion, and the intermediate layers being optionally complete.

By virtue of these arrangements, the critical temperature of the superconducting material is very greatly increased and, in at least one example, reaches 250K.

To achieve such results, it is essential that the growth mechanism of the layers is strictly monomolecular (atomic layer after atomic layer) in order to avoid mixing by thermal diffusion of the layers already deposited.

In advantageous embodiments, one and/or other of the following arrangements are employed:
- the element M is Bi;
- the electric charge reservoir consists of at least two layers composed of a calcium oxide, which are separated by at least one layer composed of at least one metal oxide;
- the metal oxide is an oxide of a metal chosen from the group comprising: Bi, Hg, Tl and Cu;
- the metal oxide is a bismuth oxide;
- the metal oxide is a copper oxide;
- n is at least equal to 6 and advantageously at least equal to 8;
- a plurality of superconducting cells are stacked alternately with electric charge reservoirs.

A further subject of the present invention is components comprising a material as defined above, in particular components employing the resistance, which is close to zero, of superconducting materials, such as interconnections, fast transistors and microwave components, or else components using Josephson junctions, such as superconducting quantum interference devices ("SQUIDs") and fast memory or switching devices for digital electronics.

Other characteristics and advantages of the material according to the invention, as well as the method for obtaining this material, will emerge during the following description of a preferred embodiment, given by way of nonlimiting example with reference to the appended drawings.

In the drawings:

FIG. 1 is a schematic sectional view representing a superconducting material according to a preferred embodiment of the invention;

FIG. 2 is a schematic view of an apparatus making it possible to fabricate the material according to the invention, and FIG. 3 is a view representing the change over time of the intensity of an RHEED electron diffraction line during the deposition of a monomolecular layer.

In the particular embodiment represented in FIG. 1, the superconducting material according to the invention is in the form of a multilayer film deposited on a perfectly polished substrate 1, preferably a monocrystal of strontium titanate ($SrTiO_3$) or of magnesium oxide (MgO), or other material.

The film which is deposited on the substrate 1 consists of mutually superposed monomolecular layers.

These monomolecular layers are distributed into two types of assemblies: electric charge reservoirs R which, in the example represented, each consist of three successive layers 2, 3, 2, and superconducting cells S, which consist of a certain number of superconducting layers 4 separated in pairs by intermediate layers 5, n being equal to 4 in the example represented.

The multilayer film deposited on the substrate 1 preferably includes a plurality of superconducting cells S and a plurality of charge reservoirs R superposed alternately.

When the film includes a plurality of superconducting cells S in its thickness, which is the most general case, the number n of superconducting layers 4 contained in one superconducting cell may possibly differ from one superconducting cell S to another. However, according to the invention, the film includes at least one cell for which n is greater than or equal to 4, and preferably n is greater than or equal to 4 for all these cells S.

n is preferably at least equal to 6.

According to the invention, the superconducting layers 4 consist of a copper oxide of chemical formula $CuO_2$, and the intermediate layers 5 are of chemical formula $Ca_{1-x}M_x$, x being a real number greater than or equal to 0 and less than or equal to 0.2.

M is a monovalent, divalent or trivalent element having an ionic radius close to that of the $Ca^{2+}$ ion, preferably bismuth.

The calcium-based intermediate layers 5 are free of strontium, in contrast to the calcium-based intermediate layers in known superconducting materials.

The intermediate layers 5 may optionally be incomplete, that is to say they may contain vacancies.

Furthermore, in the example considered, each charge reservoir R consists of two layers 2 consisting of a calcium oxide, which are separated by a layer 3 consisting of at least one metal oxide, it being possible for the metal in this oxide to be, in particular, bismuth, mercury, thallium or copper.

The number of layers 2 in each reservoir R could be greater than 2, for example of the order of 10, the calcium oxide layers 2 then being separated in pairs by layers 3 of metal oxide.

In one particular example, on which tests were performed, the number n of superconducting layers in each superconducting cell S was equal to 8, x being non-zero but less than 0.1 and the intermediary layer 3 of the charge reservoir R was a bismuth oxide.

In this particular example, it was possible to measure a very rapid drop in the electrical resistance of a sample of the material produced when its temperature is lowered, this resistance becoming substantially zero at a temperature of the order of 250K at atmospheric pressure, which is to say 115K more than the known superconducting materials which have the highest critical temperature at atmospheric pressure.

In order to produce the material according to the invention, use may advantageously be made of the technique referred to as molecular beam epitaxy (MBE).

In order to do this, as represented in FIG. 2, the substrate 1 is arranged on a heating support 8 in a vacuum chamber 6 connected to a vacuum pump 7 capable of producing a powerful vacuum.

The heating support 8 heats the substrate 1 to a temperature below 600° C., and preferably to a temperature between 300 and 600° C., in particular between 300 and 550° C. and, for example, between 300 and 500° C.

The vacuum chamber 6 includes a plurality of Knudsen cells 9, each cell 9 including, in conventional fashion, a batch of an element to be evaporated, heating means for evaporating this element into the vacuum chamber, and an aperture pointing toward the vacuum chamber, which aperture can be closed off by a cover 10. Once in vapor form in the vacuum chamber, the evaporated element condenses on the walls which it encounters and, in particular, on the substrate 1. As employed in this context, the term "evaporate" indicates that atoms or groups of atoms of the element to be deposited leave the batch contained in the Knudsen cell under the effect of an input of energy, then travel a certain distance in the vacuum chamber before being deposited on the substrate 1.

In the example represented, the device includes three cells 9, respectively making it possible to evaporate copper, calcium and bismuth or another metal.

For each cell 9, closure of the cover 10 makes it possible to prevent the vapors of the element heated in said cell 9 from entering the vacuum chamber. Furthermore, it is possible to adjust the heating power of each cell. This makes it possible to adjust the evaporation rate of the material contained in each cell, and therefore the flux of this material arriving on the substrate 1 or on a layer already deposited on the substrate 1.

Furthermore, the heating power of each Knudsen cell 9 is adjusted so that the atom flux arriving on the substrate 1 or on a layer already deposited on this substrate, and output by the various Knudsen cells 9 operating at a given instant, is between $10^{12}$ and $10^{15}$ atoms/cm$^2$.s, in particular between $10^{12}$ and $10^{14}$ atoms/cm$^2$.s and preferably close to $10^{13}$ atoms/cm$^2$.s, which substantially corresponds to the production of one layer in 100 seconds.

The atom flux in question should generally be between a nominal value, below which a monatomic layer cannot be formed, and a maximum value above which three-dimensional atom aggregates which prevent the formation of a strictly monatomic layer are unavoidably formed. These minimum and maximum values are experimentally determined for each material to be deposited.

Furthermore, the device includes an atomic oxygen source 11 which may, for example, be the OPS source (oxygen plasma source) marketed by the company RIBER (France).

In order to produce layers which include oxygen, the molecular oxygen source 11 creates a local atomic oxygen pressure between $10^{-6}$ and 10 Pa, for example between $10^{-4}$ and $10^{-3}$ Pa in the vicinity of the substrate 1.

Furthermore, in the illustrative embodiments of the method for producing the material according to the invention, the atomic oxygen source used produced a local molecular oxygen pressure substantially equal to 10 times the local atomic oxygen pressure.

Finally, the device includes a reflection high-energy electron diffraction (RHEED) system, this system including an electron gun 12, capable of accelerating an electron beam at an energy which may be, for example, 35 kev [sic], associated with a fluorescent screen 13.

During the production of each monomolecular layer of the superconducting film, the cover or covers 10 of the Knudsen cells 9 corresponding to the elements to be deposited in said layer are opened and the others remain closed. The cells are continuously heated, only the covers 10 making it possible to interrupt the deposition.

For example, in order to produce a CuO$_2$ superconducting layer 4, only the cover 10 of the Knudsen cell 9 containing copper is opened.

In order to produce an intermediate layer 5, the cover 10 of the Knudsen cell 9 containing calcium is opened. The cover 10 of the Knudsen cell 9 containing bismuth is optionally also opened if x is not equal to 0. The heating powers of the two Knudsen cells containing calcium and bismuth are preadjusted so that the total flux of calcium and bismuth atoms arriving on the last layer deposited on the substrate 1 is between $10^{12}$ and $10^{15}$ and preferably between $10^{12}$ and $10^{14}$ atoms/cm$^2$.s, and in order to respect the desired ratio between bismuth and calcium.

The atomic oxygen source 11 is in operation in all cases. Furthermore, in order to deposit a layer 2, the cover 10 of the Knudsen cell 9 containing calcium is open. Similarly, in order to produce a layer 3, the cover 10 of the Knudsen cell 9 containing bismuth is opened.

The screen 13 is monitored during the deposition of each monomolecular layer.

This monitoring firstly makes it possible to detect any possible formation of three-dimensional aggregates which could take place in spite of the precautions taken. Such aggregate formation is detected by the appearance of points on the screen. In this case, the manufacture of the superconducting film is stopped and the started film is rejected.

Furthermore, the screen 13 normally shows a network of parallel luminous lines which we will refer to in this context as "diffraction lines", the specular luminous intensity I of which is measured over time, as represented in FIG. 3. Thus, at the start of the production of a new layer, beginning at time $t_0$, a drop in the intensity I takes place, this intensity generally passing first through a minimum, then reaching a maximum at a time $t_0 + \Delta t$ (solid curve). The intensity I may possibly first pass through a maximum, then through a minimum at $t_0 + \Delta t$ At (broken curve).

According to the invention, the covers 10 of the Knudsen cells in operation for the production of this layer are closed at time $t_0 + \Delta t$ At and the atomic oxygen source is also stopped at this instant.

This prevents the formation of three-dimensional atom aggregates due to an excess material relative to the minimum quantity required to produce a monomolecular layer.

After production of the complete superconducting film, this film is removed from the vacuum chamber 6, then preferably heated for a few minutes, for example to 100° C., under a molecular oxygen atmosphere or another oxidizing atmosphere.

The method for obtaining the superconducting material according to the invention is not limited to the example described, but is susceptible of numerous variants, in particular those in which:

the molecular beams are no longer obtained by Knudsen cells, but by heating a material with an electron gun, or by laser ablation, the support 8 is not a heating support, and only the surface of the substrate or of the last layer deposited is heated, for example with a laser beam or other means.

I claim:

1. A material in the form of a film consisting of a stack of monomolecular crystalline layers superposed with one another on a substrate, including at least one first assembly of layers which constitutes an electric charge reservoir, and at least one second assembly of layers which forms a conducting cell and which consists of a certain number n of layers composed of copper oxide of the form $CuO_2$, separated from one another by intermediate layers, the charge reservoir and the conducting cell being adjacent in the stack of layers, wherein n is an integer at least equal to 4 and the intermediate layers have the chemical formula $Ca_{1-x}M_x$ and are free of strontium, x being a real number greater than 0 and at most equal to 0.2, M being a substituent element having an ionic radius sufficiently close to that of the $Ca^{2+}$ ion so as not to disturb the crystalline structure of said intermediate layers, and the intermediate layers being optionally complete.

2. Material according to claim 1, in which the element M is Bi.

3. Material according to claim 1, in which the electric charge reservoir consists of at least two layers composed of a calcium oxide, which are separated by at least one layer composed of at least one metal oxide.

4. Material according to claim 3, in which the metal oxide is an oxide of a metal chosen from the group consisting of: Bi, Hg, Tl and Cu.

5. Material according to claim 4, in which the metal oxide is a bismuth oxide.

6. Material according to claim 4, in which the metal oxide is a copper oxide.

7. Material according to claim 1, in which n is at least equal to 6.

8. Material according to claim 1, in which n is at least equal to 8.

9. Material according to claim 1, including a plurality of said conducting cells which are stacked alternately with said electric charge reservoirs.

10. Electronic component comprising a material according to claim 1, said component being chosen from the group consisting of interconnections, fast transistors and microwave components.

11. Electronic component comprising a material according to claim 1, said component including Josephson junctions.

12. Electronic component according to claim 11, chosen from the group consisting of quantum interference devices and fast memory or switching devices for digital electronics.

* * * * *